United States Patent
Zhu et al.

(10) Patent No.: US 6,284,107 B1
(45) Date of Patent: Sep. 4, 2001

(54) METHOD FOR CONTROLLING ARCING ACROSS THIN DIELECTRIC FILM

(75) Inventors: Li-Yan Zhu; Rodney Lee, both of San Jose, CA (US)

(73) Assignee: Headway Technologies, Inc., Milpitas, CA (US)

( * ) Notice: Subject to any disclaimer, the term of this patent is extended or adjusted under 35 U.S.C. 154(b) by 0 days.

(21) Appl. No.: 09/433,056

(22) Filed: Nov. 3, 1999

(51) Int. Cl.⁷ .................................................. C23C 14/34
(52) U.S. Cl. ........................................................ 204/192.2
(58) Field of Search ............................................ 204/192.2

(56) References Cited

U.S. PATENT DOCUMENTS

| | | | |
|---|---|---|---|
| 4,800,454 | 1/1989 | Schwarz et al. | 360/103 |
| 4,802,043 | 1/1989 | Sato et al. | 360/113 |
| 5,247,413 | 9/1993 | Shibata et al. | 360/113 |
| 5,272,582 | 12/1993 | Shibata et al. | 360/113 |
| 5,491,605 | 2/1996 | Hughbanks et al. | 360/113 |
| 5,539,598 | 7/1996 | Denison et al. | 360/113 |
| 5,557,492 | 9/1996 | Gill et al. | 360/113 |
| 5,699,212 | 12/1997 | Erpelding et al. | 360/104 |
| 5,761,009 | 6/1998 | Hughbanks et al. | 360/113 |
| 6,134,089 | * 10/2000 | Barr et al. | 360/322 |

* cited by examiner

Primary Examiner—Nam Nguyen
Assistant Examiner—Gregg Cantelmo
(74) Attorney, Agent, or Firm—George O. Saile; Stephen B. Ackerman; William J. Stoffel

(57) ABSTRACT

A method for preventing and controlling Arcing Across Thin Dielectric Film in sputtering and other process that generate electric fields and cause arcing across conductive structures. In a first embodiment, when the wafer is subjected to RF electric fields from a RF generating tool, the leads are oriented in a first direction which is perpendicular to the RF fields (in a second direction) generated by a RF generating tool (e.g., sputter tool). In a second embodiment, leads are shaped so that the leads extend on both sides of the ABS line so that the MR window 40 is close to the geometric center of the leads. In a third embodiment, an extraneous window or two extraneous windows are formed in a second dielectric layer under at least of a portion of a lead to that a "hot spot" area is created where arcing is more likely to occur.

7 Claims, 7 Drawing Sheets

METHOD FOR CONTROLLING ARCING ACROSS THIN DIELECTRIC FILM

BACKGROUND OF INVENTION

1.) Field of the Invention

The present invention relates generally to the manufacture of vacuum-deposited thin-film structures and more particularly to the manufacture of thin-film magnetoresistive (MR) read sensors for magnetic information storage files.

2.) Description of the Prior Art

Magnetic head disk drive systems have been widely accepted in the computer industry as a cost-effective form of data storage. In a magnetic disk drive system a magnetic recording medium, in the form of a disk, rotates at high speed. A magnetic read/write transducer, referred to as a magnetic head, is attached to or formed integrally with a "slider". The slider flies over the rotating disk surface, in order to access the entire disk surface for information storage and retrieval. The slider and its integrally formed transducer are produced en mass in the form of a wafer. The bottom surface of the slider which is defined by cutting and grinding after the wafer process is called the airbearing surface (ABS).

A state-of-art magnetic head includes an inductive write-element and a magnetoresistive (MR) read-element. A MR read-element is also abbreviated as a MR-element element. It further consists of a MR-stripe, whose resistance varies with the magnetic flux from the medium, and two magnetic shields, which help the MR-stripe to "focus-on" a narrow stripe (approximately 100 nm wide) of the medium.

There are presently two types of MR-stripe, amorphous (AMR) and giant (GMR). Regardless of the type, a MR-stripe is located between two magnetic shields. Insulation is added between the MR-stripe and each shield to avoid shunting. In pursuit of high spatial resolution, the shield-to-shield spacing (which is also called the read-gap width) is presently as low as 150 nm. Less the thickness of MR-stripe, insulation on each side of the MR-stripe is as thin as 20 nm. Each insulation typically consists of a dielectric film such as aluminum oxide or silicon oxide. It is very vulnerable to accidental dielectric breakdown, during the manufacture and usage. The dielectric breakdown, commonly called arcing, causes shunting. It may also blow up the MR-stripe.

While it is difficult to prevent arcing through the insulation, it also takes much effort to create a desired electrical connection through the same insulation. Conventionally a layer of photoresist is applied on top of the insulation, then exposed through a dedicated mask. The photoresist and the insulation are chemically etched away in areas defined by the exposure, creating via-holes. The remaining photoresist is stripped away. Finally conductive material is deposited through the via-holes, establishing desired electrical connection. This process is viable, but nonetheless costs money and time.

Very often an electrical connection through the dielectric film does not require a precisely controlled conductivity. For example, it is desirable to connect the magnetic shields and the write-core to the ground-lead of the MR-stripe. The connection helps to prevent unintentional dielectric breakdown. It also helps to reduce the readback noise in an operating disk drive. See Schwarz and Keel (U.S. Pat. No. 4,800,454), Sato el al. (U.S. Pat. No. 4,802,043), Shibata and Suyama (U.S. Pat. No. 5,247,413), Shibata el al. (U.S. Pat. No. 5,272,582), and Denison el al. (U.S. Pat. No. 5,539,598). Electrical connections caused by arcing provide adequate conductivity for the above application. However such connections are never relied upon because arcing was considered uncontrollable.

The difficulty in preventing and utilizing arcing demonstrates the need for better understanding and control of arcing in wafer process. The present invention describes novel structures and methods useful for controlling arcing in wafer process.

SUMMARY OF THE INVENTION

It is an object of the present invention to provide a method/structure for fabricating a thin dielectric film free of defects caused by accidental arcing during wafer processing.

It is another object of the present invention to provide a cost-effective method/structure for reliably establishing a desired electrical connection between two conductive structures, through a thin dielectric film.

It is an object of the present invention to provide a method/structure for fabricating a magnetoresistive read-element with ultra-thin dielectric film in the read-gap, whereby improving the spatial resolution of said read-element.

It is another object of the present invention to provide a method/structure for fabricating a magnetoresistive read-element with ultra-thin dielectric film in the read-gap, free of defects caused by accidental arcing.

It is a further object of the present invention to provide a method/structure for fabricating a magnetic head having a write-element and a magnetoresistive read-element that is insensitive to the static noise.

It is yet another object of the present invention to provide a method/structure for fabricating a magnetic head having a write-element and a magnetoresistive read-element that is insensitive to accidental arcing and to the static noise, without the extra process of creating a dedicated via-hole.

The invention provides methods for preventing and controlling arcing across thin dielectric film in sputtering and other process that generate electric fields and cause arcing across conductive structures.

In a first embodiment, the wafer is subjected to a radio frequency electric field, the leads are oriented in a first direction which is perpendicular to the RF fields (in a second direction).

In a second embodiment, leads are shaped so that the MR stripe is close to the geometric center of the leads, thereby placing the MR-stripe at or near the node of standing wave, hence preventing arcing at the MR-Stripe.

In a third embodiment, an extraneous window is formed in a second dielectric layer under at least one end of a lead in to that a "weak spot" coincides with an anti-node of the standing wave, hence promoting the occurrence of desired arching.

Additional objects and advantages of the invention will be set forth in the description that follows, and in part will be obvious from the description, or may be learned by practice of the invention. The objects and advantages of the invention may be realized and obtained by means of instrumentalities and combinations particularly pointed out in the append claims.

BRIEF DESCRIPTION OF THE DRAWINGS

The features and advantages of a thin-film structure according to the present invention and further details of a process of fabricating such a thin-film structure in accordance with the present invention will be more clearly understood from the following description taken in conjunction with the accompanying drawings in which like reference numerals designate similar or corresponding elements, regions and portions and in which:

FIG. 1A shows the top plan view of the MR-stripe and its leads.

FIG. 2A shows the top plan view of the wafer with respect to an alternating electrode. As shown in FIG. 2A: the wafer carrying partially deposited conductor leads moving toward an electrode, hence subject to a RF electric field having horizontal component. The field creates a fluctuating potential at the MR-stripe, causing dielectric breakdown in the window 40.

FIG. 3A is a top view. FIG. 3B is a side view.

FIG. 5A shows a conductive film covered completely by a continuous dielectric film, and partially by a photoresist film. FIG. 5B shows a via-hole etched through the dielectric film, in the openings of photoresist. FIG. 5C shows the wafer with all photoresist stripped away. FIG. 5D shows a second conductive film deposited over the dielectric film, and through the via-hole.

In FIG. 9, all other features are identical to FIG. 7 and FIG. 8, except that there are two extraneous windows 44A 44B. Both extraneous windows 44A 44B must be on the same side of MR-stripe 24. Else resistance measurement of the stripe 24 will be impossible.

DETAILED DESCRIPTION OF THE PREFERRED EMBODIMENTS

Figure 1A:
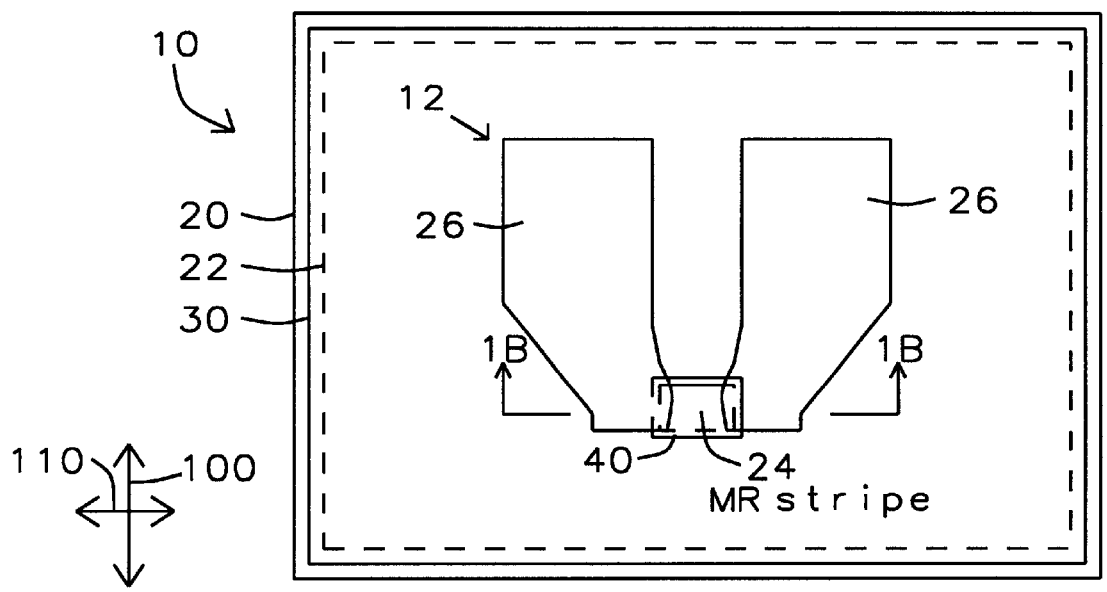
FIG. 1A shows a MR layout known by the inventors which is susceptible to unintentional arcing.

As a prior art of MR-element design, the thickness of dielectric film between the MR-stripe and each shield is not uniform. To achieve high spatial resolution, the dielectric film is made as thin as possible in the read-gap. To minimize the risk of dielectric breakdown, the dielectric film is thickened elsewhere on the wafer. Thus there are "weak spots" in the dielectric film, particularly in the read-gap where arcing is most harmful.

Also as a prior-art of the MR-element construction, the wafer in vacuum process is subject to an electric field which consists of both direct (DC) and alternating (AC) portions. The AC field further includes a component parallel to the wafer surface. Thus each conductive structure on the top of the wafer contains a standing wave. The peak electric potential is greatest at both ends of each conductor, in the direction of AC field. These ends are the "hot-spots" for dielectric breakdown. For a purely DC field, the hot-spots are at corners and along edges of each conductor, where the electrostatic field is strongest.

In a first embodiment of the present invention, to prevent arcing due to the AC field, a weak-spot must be located away from any hot-spot, preferably in the geometric center of the conductive structure. Because the location of a weak-spot, namely the read-gap, is fixed, the hot-spot(s) must be moved away from the weak-spot. This is accomplished by re-aligning the wafer with respect to the AC field, or by extendin or re-arranging the conductor leads in the top plan view of the wafer.

In second and third embodiments, novel techniques for controlling arcing, are described. To promote arcing, in the second embodiment, a hot-spot is intentionally made hotter by extending, the conductor length in the direction of expected AC field, and by multiplying edges and corners of the conductive structure. In the third embodiment, a dedicated weak-spot is created, by creating an extraneous window in the second dielectric film. The hot-spot and the dedicated weak-spot are made to coincide. The wafer is then subject to an alternating electric field which naturally occurs in a normal manufacturing-process. The field preferentially creates an arcing in the weak spot. An electrical connection is thus established across the dielectric film, without the use of a via-hole.

Below is a brief (incomplete) nomenclature:

TABLE 1

Partial list of Nomenclature wafer 10
MR-element 12
electrode 14
a ceramic substrate 20
first magnetic shield 22
The MR-stripe 24
Conductive leads 26
combination of MR-stripe and leads 28
Undercoat 30
A thin layer of dielectric 32
additional layer 34
photoresist 36
small windows 40
openings 42
extraneous windows 44A 44B
electrical connection 46
magnetic read/write transducer = magnetic head
magnetoresistive (MR) read-element
MR read-element = MR-stripe + 2 magnetic shields
shield-to-shield spacing = read-gap width
dielectric breakdown = arcing

First Embodiment

Method of Positioning Wafer with Respect to the Electrode

I. Prevention of Accidental Arcing—Problem the Invention Alleviates

Figure 1B:
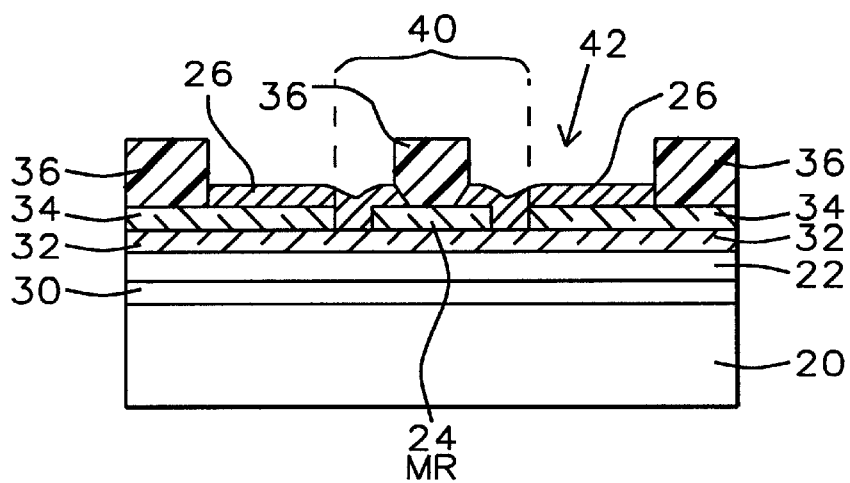
FIG. 1B shows a cross sectional view through the MR-stripe along axis 1B in FIG. 1A.

The problem that the invention solves is discussed. The problem of accidental arcing will be illustrated through a solid example. In the production, each wafer is divided into head areas 10 and each wafer contains an array of approximately 10,000 MR-elements 12. For convenience only head area 10 and one MR-element 12, greatly exaggerated in size, is shown in FIGS. 1A and 1B. A dielectric film (typically alumina oxide 3 $\mu$m thick), commonly called the undercoat 30, is applied over a ceramic substrate 20. A first magnetic shield 22 (a ferromagnetic film approximately 3 $\mu$m thick) covers substantially the entire surface of wafer 10. A thin layer of dielectric 32 (typically 20 to 50 nm thick of aluminum oxide or silicon oxide) is then deposited over the entire wafer surface. An additional layer 34 of the same dielectric material (typically 30 nm or thicker) is next deposited over selected regions the first layer 32, using a mask (not shown). This second layer 34 of dielectric covers most of the wafer surface, except in a small MR window 40 which is defined by the mask. The total dielectric thickness in the window 40 is therefore smaller than the total dielectric thickness outside of the window 40. The wafer is later cut along the ABS line 66.

A MR-stripe 24, which consists of one or more conductive layer(s) and is approximately 10 nm thick, is constructed on top of dielectric 32, within window 40. Conductive leads 26 are then deposited on both ends of the MR-stripe 24, in openings 42 outlined by photoresist 36.

As shown in FIGS. 1A and 1B, the inventors found the weak spot where the ARCing occurs (window 40, where the additional dielectric layer 34 is absent) is located at one end of the MR 24/ conductor lead 26 structure. Thus the wafer is susceptible to alternating electric fields in the directions shown by the arrow 100. It is far less susceptible to alternating electric fields shown by arrow 110.

A. Alternating Electric Field Causes Arcing During Lead Deposition—FIGS. 2A and 2B Wafer 10 is often subject to an alternating electric field during normal process. For example, leads 26 (FIGS. 1A & 2A) are typically deposited in the vacuum, using a radio-frequency (RF, typically 10.4 MHz) sputter process. See FIG. 2A.

Figure 2A:
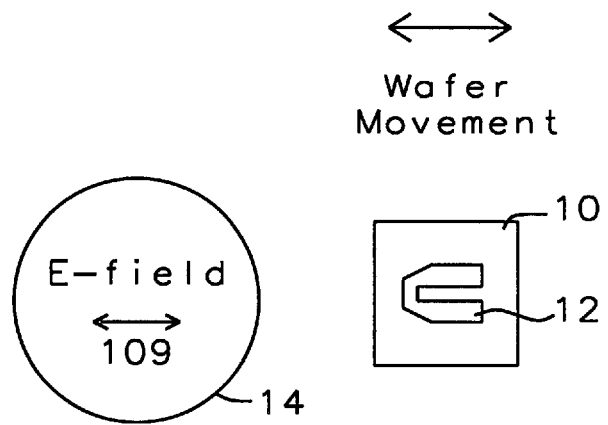
FIG. 2A shows a cause of unintentional arcing.

FIG. 2A shows a top plan view of the wafer 10 with an integral conductive structure 28, which is comprised of the MR strip 24, leads 26 in FIGS. 1A and 1B. The wafer 10 passes under an electrode in a sputter tool.

Figure 2B:
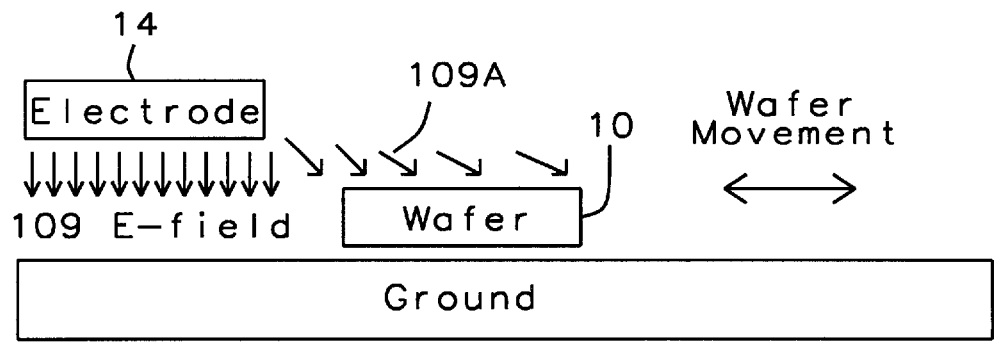
FIG. 2B shows the side view of the wafer with respect to the electrode.

As shown in FIGS. 2A and 2B, in the sputter process wafer 10 passes a few inches under an electrode 14, which is connected to a high-voltage RF potential source (not shown). The electrode 14 can have any shape and is not limited to the shape shown in the FIGS. The electrode generates a field 109 in a first direction as shown by the arrows 109.

As the wafer 10 approaches (or moves away from) electrode 14, the integral conductive structure 28 which comprises of MR-stripe 24 and leads 26, in FIG 1A & 1B) acts as an antenna. A standing wave is generated in the structure 28. The potential fluctuates within structure 28. The peak potential is greatest at both ends of structure 28, in the direction of the RF field.

Traditionally the antenna effect is neglected because structure 28 is very short, (typically less than 1 mm), and is a fairly good conductor. However, the applied RF field is very strong. When the leads 26 are still very thin (for example just a few mm), their conductivity is relatively poor. Thus the structure 28 can pick up a few volts of RF potential, which is enough to arc through the ultra-thin dielectric film 32.

As shown in FIGS. 2A and 2B, the wafer 10 carrying partially deposited conductor leads 12 moving toward an electrode 14, hence subject to a RF electric field having horizontal component in a first direction 109. The field 109 creates a fluctuating potential, whose peak is located on the MR-strip, this causing dielectric breakdown in the window 40.

Figure 2C:
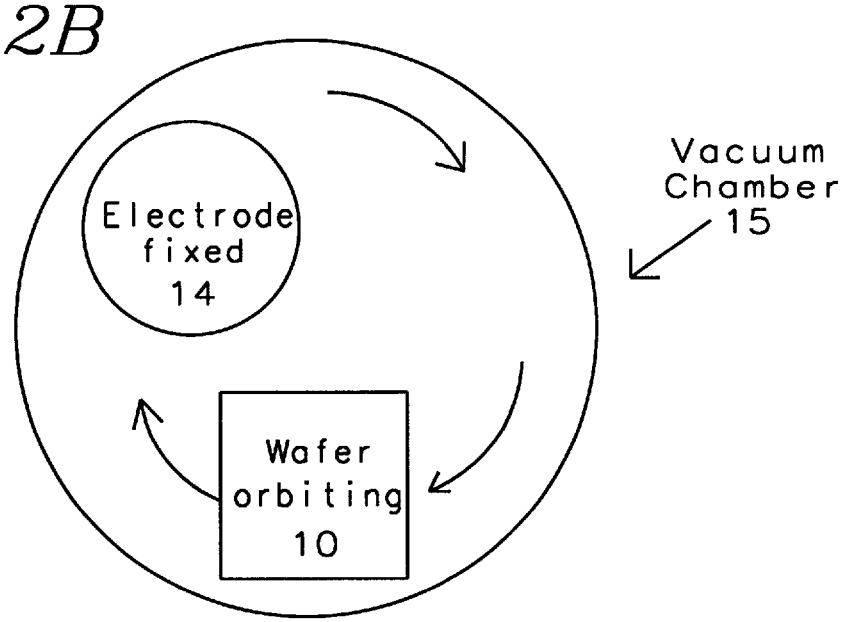
FIG. 2C shows the wafer movement within the vacuum chamber.

FIG. 2C shows the wafer 10 movement (circular) within the vacuum chamber 15. The wafer 10 passes under the electrode 14 again and again in a circular orbit. This wafer movement also applies to the wafer movements in FIGS. 3A and 3B.

The MR-Stripe is susceptible to horizontal e-field. The e-field is vertical (hence not so damaging directly under the electrode 14. The e-Field is sloped, thus having horizontal component away from the electrode 14. Of course the e-field is weaker further away from the electrode 14. The strongest horizontal component of E-field occurs when the MR stripe is at a distance approximately equating the height of the bottom of the electrode. The field 109 creates a fluctuating potential at the MR-stripe, causing dielectric breakdown in the window 40. The E-field 109 is shown by the arrows. The arrow 109A indicates approximately where the horizontal component is greatest.

As leads 26 (See FIGS. 1A and 1B) grow thicker, their conductivity improves. The peak potential in the antenna drops. It has been verified experimentally that arcing occurs only in the early stages of lead deposition. Further investigation leads to the discovery of a novel technique of the invention.

II. $1^{st}$ Embodiment—Altering the Wafer Orientation in an RF Field

In a critical findings, the inventors have determined that the arcing can be reduced significantly by altering the orientation of wafer 10 in the sputter (vacuum) chamber (not shown), so that the axis of symmetry of the conductive structure 28 is perpendicular to the electric RF field 109 generated by the sputter electrode 14. See FIG. 3A.

Figure 3A:
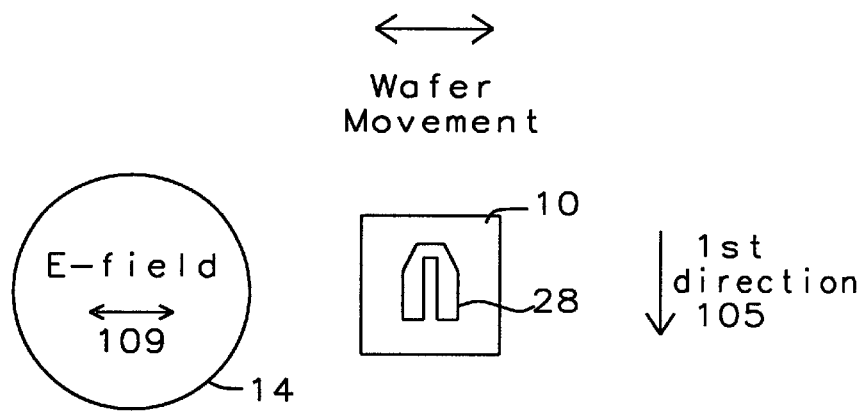
FIGS. 3A & 3B show a novel technique for preventing the unintentional arcing shown in FIG. 2A, by changing the orientation of the wafer with respect to the alternating field.
Figure 3B:
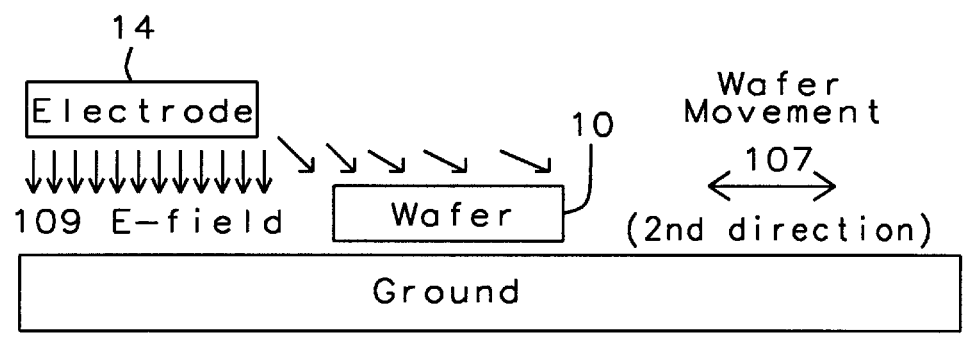

FIG. 3A shows the invention's novel lead deposition process that has a preferred orientation of the MR leads. As shown 3A, the mechanism for this improvement is understood in light of the forgoing description: By altering the orientation of wafer 10, the weak-spot (window 40) is moved from the end of the antenna (structure 28) to the middle of the antenna (structure 28). Thus the weak spot is moved from a hot-spot (an antinode of the standing wave) to a neutral position (a node of standing wave).

Referring to FIG. 3A, the wafer carrying partially deposited conductor leads moving toward an electrode, hence subject to a RF electric field having horizontal component. The field creates a fluctuating potential at the MR-stripe, causing dielectric breakdown in the window 40.

The 1st embodiment can be summarized as below:

TABLE

Summary of 1st embodiment

Figure 5A:
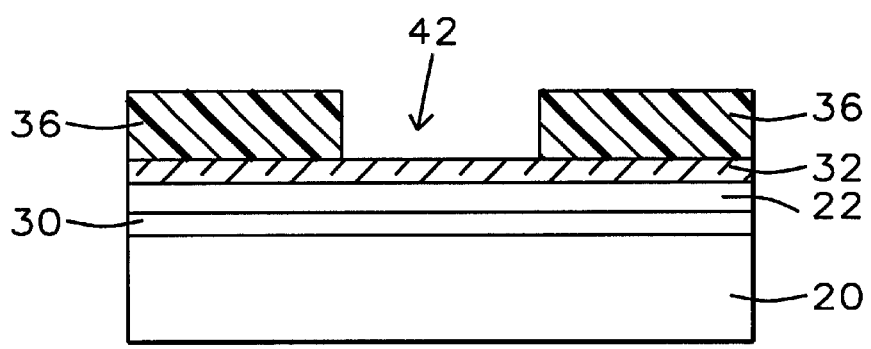
FIGS. 5A, 5B, 5C, and 5D show a process known by the inventors for establishing an electrical connection through a dielectric film.
Figure 5B:
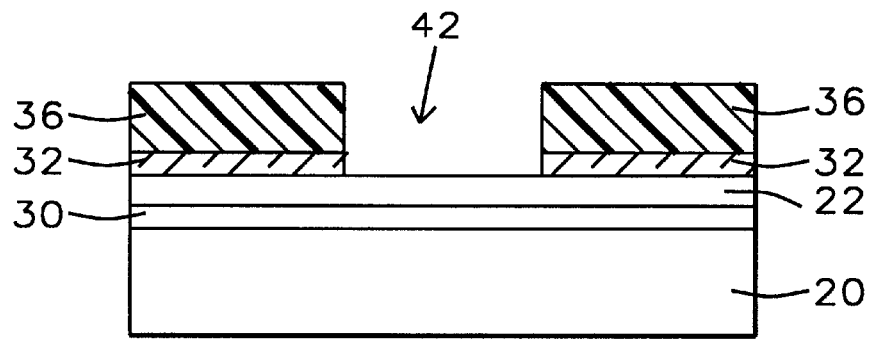
Figure 5C:
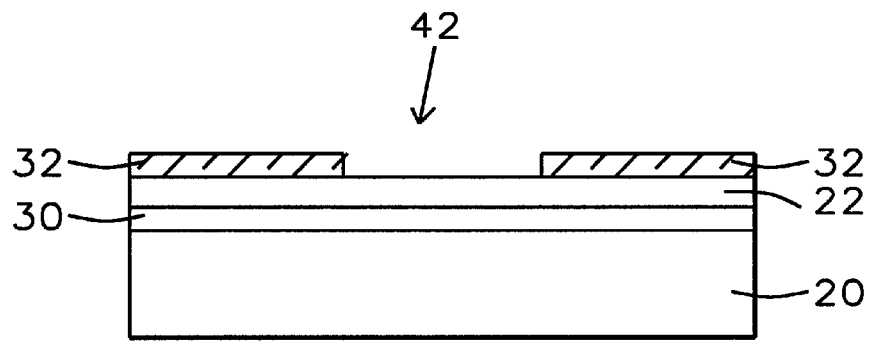
Figure 5D:
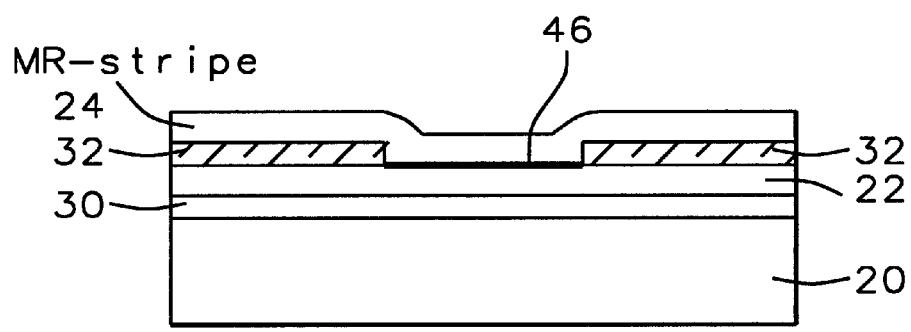

FIG. 5A and FIG. 3A -- Providing a wafer 20 with an overlying shield layer 22, forming a first dielectric layer 32 over the shield layer 22; forming a second dielectric layer 34 over the first dielectric layer; patterning the second dielectric layer 34 to form a MR window 40; forming a MR stripe 24 over the first dielectric layer in the MR window 40;
forming a resist layer over the second dielectric layer and the MR stripe; the resist layer having two lead openings that define two leads; the lead openings extend from the MR window 40 in a first direction 105;
placing the wafer 20 in a sputtering tool having an electrode 14 that generates an alternating electric field 109 in a second direction 103;
aligning the wafer in the sputtering tool such that the second direction so that the first and the second directions are perpendicular;
Sputtering a lead layer 26 over the MR stripe 24 in the window and over portions of the second dielectric layer; the leads extending in a first direction from the MR stripe.

Second Embodiment

Method of Preventing Arcing by Geometric Symmetry

Figure 4:
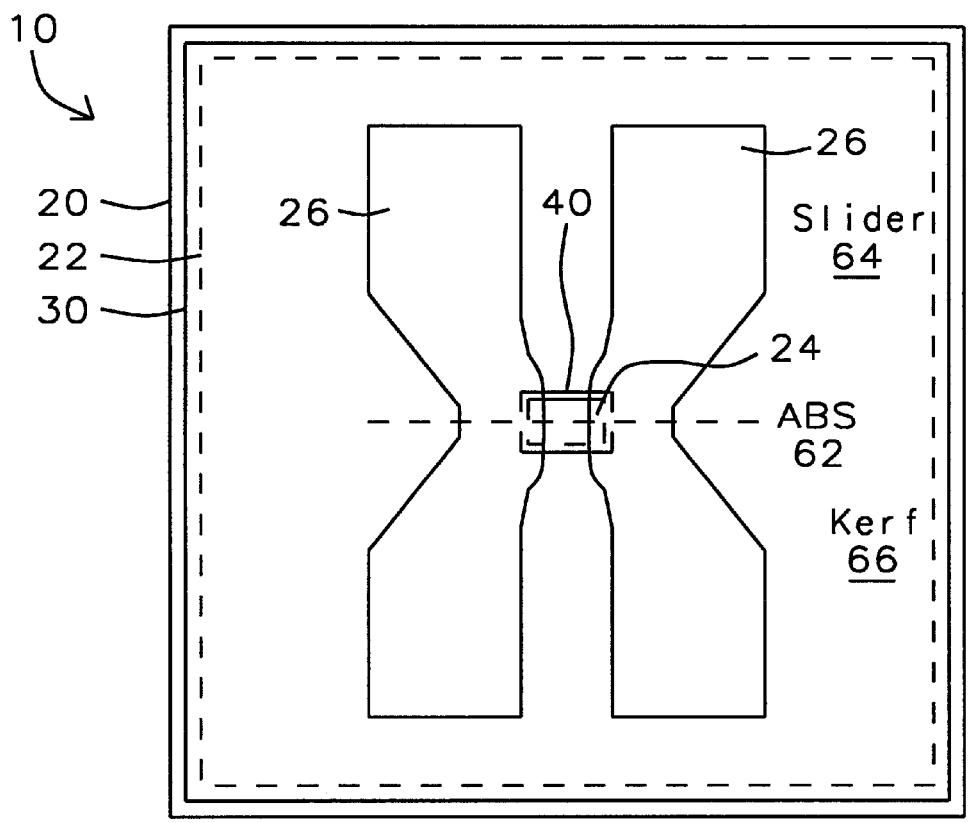
FIG. 4 shows top down view of a preferred embodiment of the invention, where the susceptibility of arcing to an alternating electric field is reduced by geometric symmetry.

In case the orientation of alternating electric field is variable or unpredictable, a preferred embodiment is shown in FIG. 4. Leads 26 are extended, so that window 40 is located in the geometric center of structure 28. Thus alternating electric field, regardless of its direction, is minimized at window 40. As long as structure 28 is reasonably symmetric about at least two distinct axes, the novel configuration shown in FIG. 4 is very effective against unintentional arcing caused by alternating electric field.

The preferred embodiment shown in FIG. 4, obviously results in a bigger structure 28 in the top plan view of the wafer 10. This does not result to any reduction in the number of read-element 12 per wafer 10, which is determined by the slider size and kerf size. The expansion of leads 26 primarily occurs in wafer area which will be consumed as kerfs in the slider process.

A vacuum process such as ion-beam bombardment and sputter also causes an electrostatic (DC) potential on the surface of wafer 10. In the solid example cited above, this DC potential can also cause arcing in window 40. Most often, arcing is caused by the superposition of DC and AC fields. Relocation of the window 40 into the center of geometry is effective against incidental arcing caused by the AC field. However it does not protect window 40 from the DC field. To prevent DC-field induced arcing in window 40, the conductive structure 28 and the magnetic shield 22 should be connected elsewhere. A novel method for reliably making the desired connection is described next.

Third Embodiment

Option 1—Method for Inducing Arcing in Sacrificial Sites(s)

FIGS. 5A–5D, show a process known by the inventors for establishing electrical connect between the MR stripe 24 and the shield 22, across a dielectric film 32. Shield 22 is first covered completely by a dielectric film 32. A photoresist film 36 is applied over, and completely covers the dielectric film 32. An opening 42 is created in photoresist film 36, through mask exposure and development. The opening 42 is deepened by chemical etching through the dielectric film 32. Photoresist film 36 is then stripped away. The remaining opening 42 in dielectric film 32 is now called a via-hole. MR-stripe 24 is then deposited through the via-hole 42, establishing electric contact with shield 22. Disadvantageously, this method requires a mask and extra photo and chemical processes.

A. Option 1—FIG. 6—form Extraneous Window in Dielectric Layer Between Lead 26 and Shield 30 by Arcing FIG. 6 shows a preferred embodiment of the present invention.

The desired electrical connection is established through controlled arcing. Similar to the novel structure in FIG. 4, the conductor leads 26 are elongated in the direction of anticipated RF field. This effectively increases the peak potential at both ends of the leads 26. An extraneous window 44 is created in dielectric film 34, simultaneously with window 40, without additional mask or process. When wafer 10 is subject to a RF field during a normal deposition process of lead 26, dielectric film 32 under the extraneous window 44 breaks down preferentially, due to combined effect of high peak electric potential and thin dielectric film.

Figure 6:
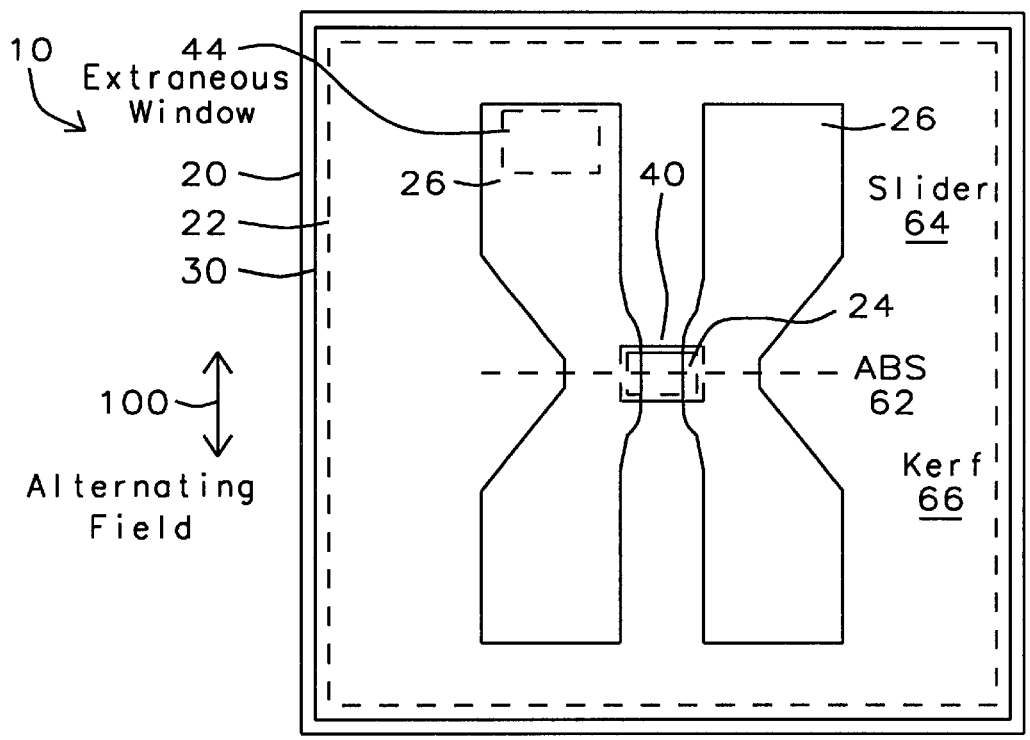
FIG. 6 shows a preferred embodiment of the invention, where an extraneous window 44 of the invention is created in the additional dielectric 34, under lead 26 and near on of its ends, thereby facilitating the establishment of a permanent electrical connection between the shield 22 and the structure 28 by controlled arching in an AC field.

Referring to FIG. 6, all other features are identical to FIG. 4. Only an extraneous window 44 is added. Windows 40 and 44 are identical except in location. Thus they are made together, without additional mask or process.

When the wafer 20 is subject to an alternating field having a component parallel with the wafer surface, the extraneous window 44 is at an anti-node of the standing wave. This is because window 44 is located at a corner of conductive structure 28. In the particular example shown in FIG. 6, the structure is longer in directive 100 than in direction 10. This arcing occurs more easily when the alternating electric field is in direction 100 than the alternating field is in direction 110. Arching through window 44 creates a permanent electrical connection between shield 22 and structure 28.

B. Option 2—FIG. 7—An Improved Method for Establishing a Permanent Electrical Connection.

Figure 7:
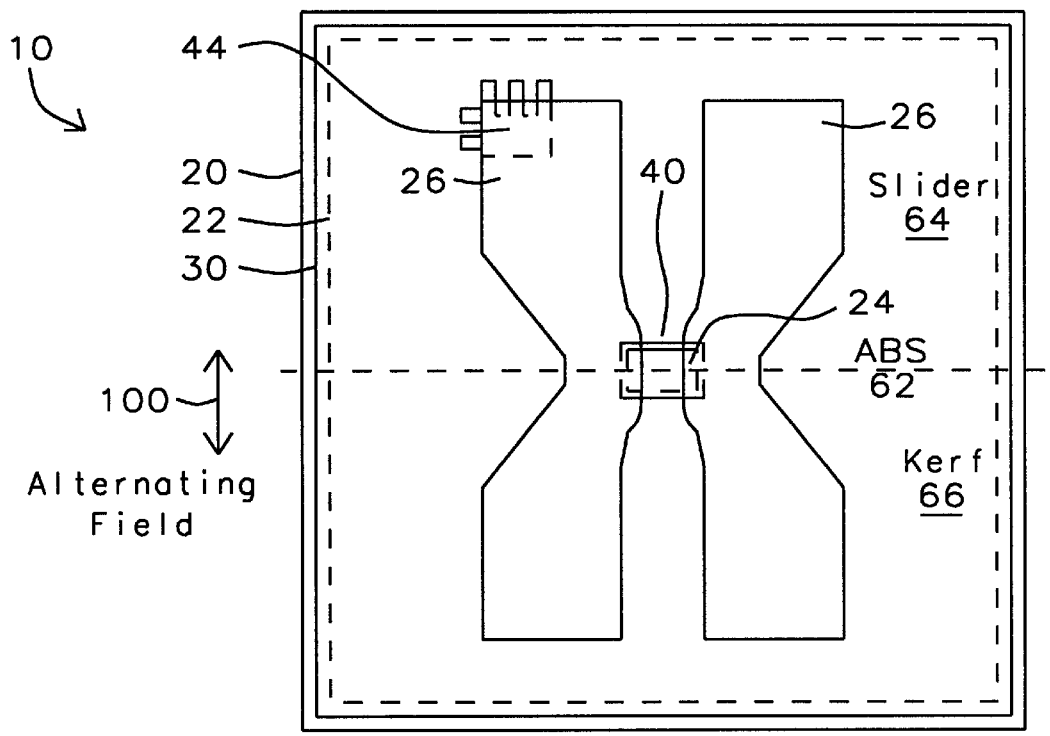
FIG. 7 shows another top plan view of a preferred embodiment of the invention, where a first extraneous widow 44 is shaped and located to overlap with a corner of the lead 26. The controlled arcing is further enhanced by defects and field strength along the edge of lead 26.

FIG. 7 shows an improvement of the embodiment depicted in FIG. 6. The extraneous window 44 is shaped with "fins" and relocated such that its boarder intersects the corner of conductor lead 26 in multiple locations. This results in more reliable arcing in the extraneous window, due to the following factors: First the electric field is stronger at corners, and along edges, than in the interior of a parallel capacitor. Second the dielectric film 32 tends to have more defects at corners, and along edges of each photo pattern, including window 44 and lead 26. Obviously, the extraneous window 44 can also be enlarged. As long as window 44 does not extend into MR-stripe 24 and the other lead 26 on opposite end of MR-stripe 24, there is no risk of shunting by accidental arcing. However the probability of desired arcing and desired electrical connection is improved.

C. Option 3—a Removable Electrical Connection

Figure 8:
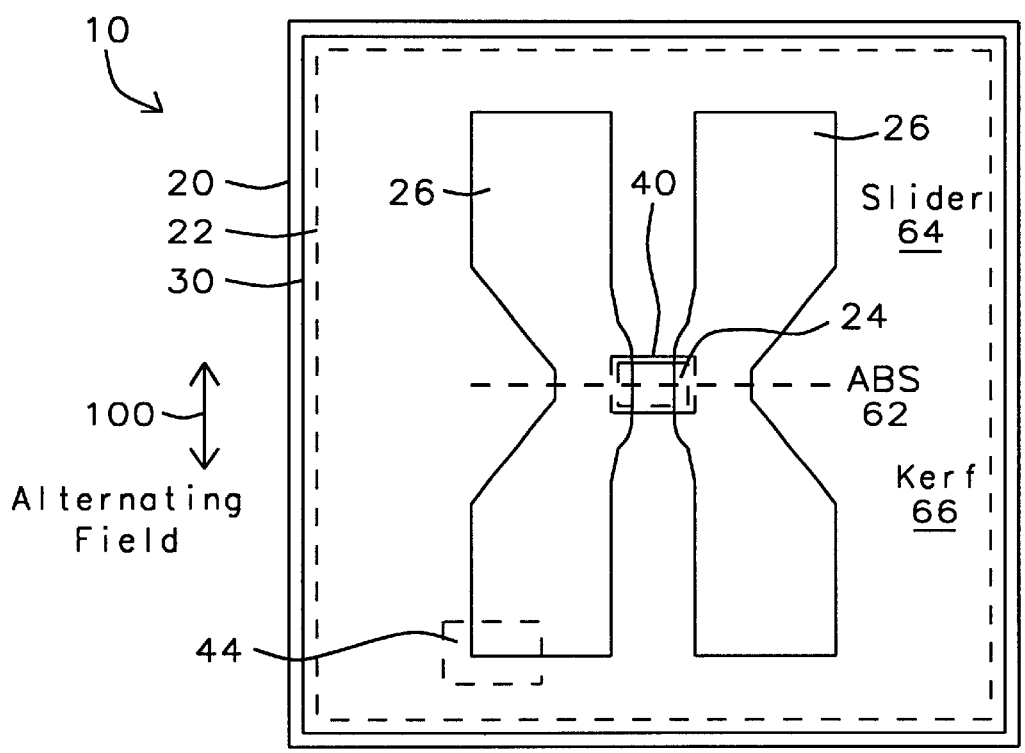
FIG. 8 shows another top plan view of a preferred embodiment of the invention, where the electrical connection is located below the ABS, hence removable subsequently in slider fabrication.

FIG. 8 shows a preferred embodiment for establishing a removable electrical connection between the conductive structure 28 and the magnetic shield 22. It is similar to FIG. 77 except that the extraneous window 44 is relocated on the kerf-side of lead 26. Similar to the permanent connection created in FIG. 6, the extraneous window 44 can be located entirely within leads 26. However the connection is generated more reliably when the extraneous window 44 intersects an edge or a corner of lead 26. The structure of window 44 and the process of causing arcing are the same as generating a permanent connection. The connection is removable because it is located in the kerf-side 26 of airbearing surface (ABS). It protects dielectric film 32 against accidental arcing during wafer process. The connection is removed during slider fabrication. It offers no protection to film 32 thereafter.

D. 4th OPTION—Two Extraneous Windows 44A 44B Are Created Under Leads 26

Figure 9:
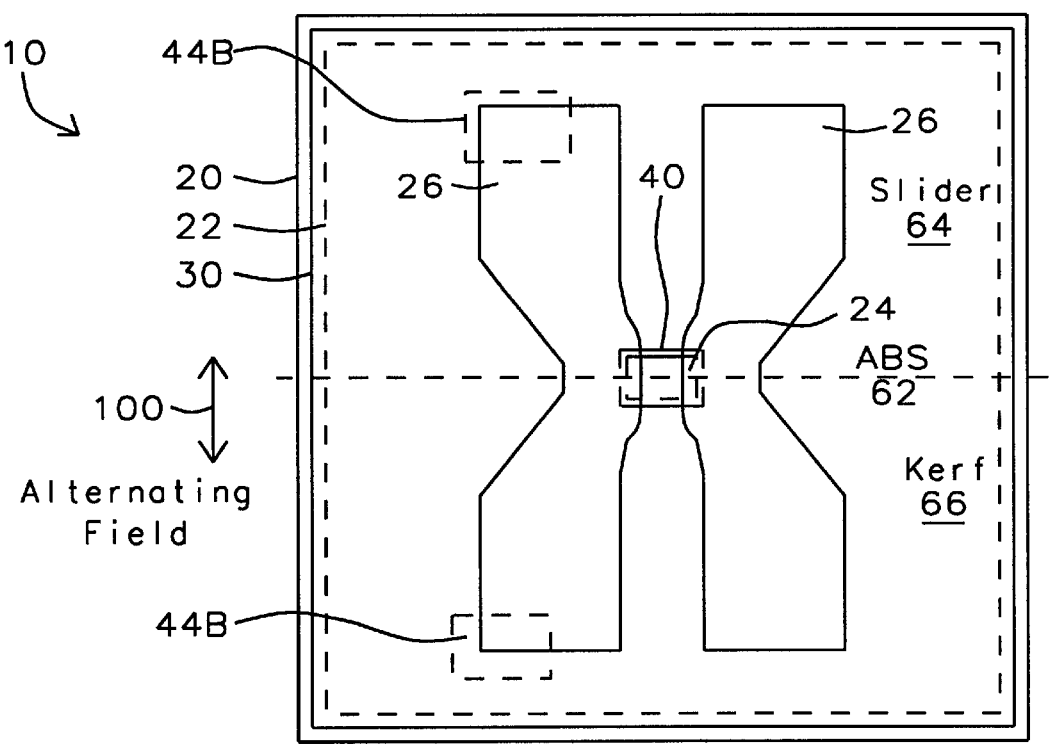
FIG. 9 shows another preferred embodiment of the invention, where the yield of electrical connection is improved in an alternating field.

FIG. 9 shows a variation of preferred embodiment, in which two extraneous windows 44A 44B are created under leads 26. Note that both windows 44A 44B are preferably on the same side of MR-stripe 24 (e.g. under one lead), so that resistance measurement of stripe 24 is unaffected by shield 22. In a predominately AC field, arcing through either one of the two extraneous windows 44 improves the probability of arcing through the remaining window 44. However in a predominately DC field, arcing through either one of the two windows 44 greatly reduces the probability of arcing through the remaining window 44. This is because the first arc establishes equipotential across the dielectric film 22, whereby preventing subsequent arcing. The embodiment with dual extraneous windows 44 is advantageous over the embodiment with a single extraneous window 44 in two cases. First, at least one connection is desired, regardless of the location (in either of windows 44). Second, a permanent connection is desired, and the expected field is known to be predominately AC.

The description of the invention and its preferred embodiments are set forth using an example where dielectric breakdown of $1^{st}$ dielectric film 32 is of interest. However the principles can be easily adapted to other dielectric film by people skilled in the relevant art, The invention can also be applied to thin-film structure other than MR-element.

While the invention has been particularly shown and described with reference to the preferred embodiments thereof, it will be understood by those skilled in the art that various changes in form and details may be made without departing from the spirit and scope of the invention.

What is claimed is:

1. A method for avoiding accidental arcing, before, during and after, a sputter process for sputtering MR leads, comprising the steps of:
   a) providing a wafer with an overlying shield layer, said wafer having a head area; said head area divided by an ABS line which defines a kerf side area and a slider side area;
   b) forming a first dielectric layer over said shield layer;
   c) forming a second dielectric layer over said first dielectric layer;
   d) patterning said second dielectric layer to form a MR window and an first extraneous widow in an area where a lead opening will be formed; said MR window and said exposing said first dielectric layer;
   e) forming a MR stripe over said first dielectric layer in said MR window;
   f) forming a resist layer over said second dielectric layer and said MR stripe; said resist layer having first and second lead openings that define two leads; said lead openings extend from said window in a first direction so that said MR window is the symmetric axis of said lead openings and that one of said first or second lead opening connect said MR window and said first extraneous window being located at a tip of said first or second lead opening in said first direction;
   g) placing said wafer in a sputtering tool having an electrode that generates an electric field in a second direction;
   h) sputtering a lead layer over said resist layer and said second dielectric layer and said MR stripe;
   i) removing said wafer from said sputtering tool.

2. The method of claim 1 wherein said first extraneous window only partially overlaps said lead opening and said first extraneous window is located in said slider side area.

3. The method of claim 1 wherein said first extraneous window is located in said slide side area, therefore remains permanently under said leads.

4. The method of claim 1 wherein said first extraneous window has a least one serrated edge under said lead opening; whereby maximizing a number of defects which often exist along edges of said first extraneous window, thus improving the probability of arching through said extraneous window.

5. The method of claim 1 wherein said lead opening has at least one serrated edge over said first extraneous window, where by maximizing a number of defects which often exist along edges of said lead opening and the number of sites having sharp curvature, thus improving the probability of arcing through said extraneous window.

6. The method of claim 1 wherein said first extraneous window is located in said kerf side area, therefore removable from said leads in subsequent processes.

7. The method of claim 1 which further includes in step (d):
   patterning said second dielectric layer to form second extraneous window, said second extraneous window formed on said slider side area; and
   said first extraneous window is located in said kerf side area; and
   wherein said first and second extraneous windows only overlaps a portion of said first lead opening.

* * * * *